United States Patent
Baek et al.

(10) Patent No.: US 9,999,141 B2
(45) Date of Patent: Jun. 12, 2018

(54) PRINTED CIRCUIT BOARD AND METHOD FOR MANUFACTURING THE SAME

(71) Applicant: SAMSUNG ELECTRO-MECHANICS CO., LTD., Suwon-Si (KR)

(72) Inventors: Yong-Ho Baek, Seoul (KR); Kyung-Hwan Ko, Gimhae-si (KR); Jung-Hyun Cho, Busan (KR); Jung-Hyun Park, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 85 days.

(21) Appl. No.: 15/133,586

(22) Filed: Apr. 20, 2016

(65) Prior Publication Data
US 2017/0094797 A1    Mar. 30, 2017

(30) Foreign Application Priority Data

Sep. 25, 2015 (KR) .......................... 10-2015-0136782

(51) Int. Cl.
*H05K 1/18* (2006.01)
*H05K 3/46* (2006.01)
*H05K 3/00* (2006.01)

(52) U.S. Cl.
CPC ........... *H05K 3/4697* (2013.01); *H05K 1/185* (2013.01); *H05K 3/4682* (2013.01); *H05K 3/0011* (2013.01); *H05K 3/0035* (2013.01); *H05K 2201/09127* (2013.01); *H05K 2201/09563* (2013.01); *H05K 2201/10636* (2013.01); *H05K 2203/1469* (2013.01)

(58) Field of Classification Search
CPC ......... H05K 1/185; H05K 2201/09127; H05K 2201/09563; H05K 2201/10636; H05K 2203/1469; H05K 3/0011; H05K 3/0035; H05K 3/4682; H05K 3/4697
See application file for complete search history.

(56) References Cited

U.S. PATENT DOCUMENTS

| | | | |
|---|---|---|---|
| 6,172,423 B1 * | 1/2001 | Lee .......................... | H01L 23/13 257/685 |
| 6,359,235 B1 * | 3/2002 | Hayashi ............ | H01L 23/49894 174/255 |
| 2006/0003495 A1 * | 1/2006 | Sunohara ............ | H01L 21/4857 438/124 |
| 2012/0006469 A1 | 1/2012 | Inagaki et al. | |

(Continued)

FOREIGN PATENT DOCUMENTS

| | | |
|---|---|---|
| JP | 2014-116548 A | 6/2014 |
| JP | 2015-35497 A | 2/2015 |

(Continued)

*Primary Examiner* — Yuriy Semenenko
(74) *Attorney, Agent, or Firm* — NSIP Law (57) ABSTRACT

A printed circuit board and a method of manufacturing the same is described herein. The printed circuit board includes a first insulating layer having a first circuit embedded in a first surface thereof, a second insulating layer disposed on a second surface of the first insulating layer, the second insulating layer having a cavity therein, an electronic component mounted inside the cavity with an adhesion member, and a third insulating layer disposed on the second insulating layer to embed the electronic component.

10 Claims, 10 Drawing Sheets

(56) References Cited

U.S. PATENT DOCUMENTS

| | | | |
|---|---|---|---|
| 2013/0299223 A1* | 11/2013 | Yoo ..................... | H05K 3/4697 |
| | | | 174/259 |
| 2015/0010694 A1* | 1/2015 | Miyazaki ............. | H05K 3/4647 |
| | | | 427/96.9 |
| 2015/0043183 A1* | 2/2015 | Ishiguro ................ | H05K 1/185 |
| | | | 361/761 |
| 2017/0265298 A1* | 9/2017 | Zhang .................. | H05K 1/0298 |

FOREIGN PATENT DOCUMENTS

| KR | 10-2015-0004734 A | 1/2015 |
|---|---|---|
| KR | 10-2015-0010155 A | 1/2015 |

\* cited by examiner

PRINTED CIRCUIT BOARD AND METHOD FOR MANUFACTURING THE SAME

CROSS REFERENCE TO RELATED APPLICATION(S)

This application claims the benefit under 35 U.S.C. § 119(a) of Korean Patent Application No. 10-2015-0136782 filed on Sep. 25, 2015 in the Korean Intellectual Property Office, the entire disclosure of which is incorporated herein by reference for all purposes.

BACKGROUND

Field

The following description relates to a printed circuit board and a method for manufacturing the same.

Description of Related Art

Multilayer board technologies which form wiring layers in circuit boards, for example, printed circuit boards have been developed in response to demands for electronic devices with lighter weights, smaller sizes, faster speeds, greater capabilities and higher performances. Technologies which mount electronic elements including active elements or passive elements in multilayer boards have been also developed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, printed circuit board includes a first insulating layer having a first circuit embedded in a first surface thereof, a second insulating layer disposed on a second surface of the first insulating layer, the second insulating layer having a cavity therein, an electronic component mounted inside the cavity with an adhesion member, and a third insulating layer disposed on the second insulating layer to embed the electronic component.

The cavity may be formed at a position corresponding to at least a part of the first circuit.

A groove may be formed to be extended into a side at a bottom of the cavity. The adhesion member may be disposed between the bottom of the cavity and the electronic component, and fills the groove.

The cavity may pass through from a first surface of the second insulating layer to a second surface of the second insulating layer.

The printed circuit board may further include a second circuit disposed on the second surface of the first insulating layer.

The printed circuit board may further include an external terminal disposed on at least a part of the first circuit and protruded from the first surface of the first insulating layer. The printed circuit board may further include a solder resist layer formed on the first surface of the first insulating layer to expose a part of a side surface of the external terminal and cover a portion of the first circuit on which the external terminal is not formed. The printed circuit board may additionally include a via formed to pass through the first insulating layer to connect between the electronic component and the first circuit on which the external terminal is formed.

The printed circuit board may include a via passing through the first insulating layer and the adhesion member, the via connecting the first circuit and a connection terminal of the electronic component.

The printed circuit board may further include a third circuit disposed on a second surface of the third insulating layer, the second surface being opposite a surface of the third insulating layer in contact with the second insulating layer. The printed circuit board of claim 19, further comprising a via passing through the third insulating layer, the via connecting the third circuit and a connection terminal of the electronic component.

In another general aspect, a method for manufacturing a printed circuit board includes forming a first circuit on a carrier, disposing a first insulating layer on the carrier to embed the first circuit in a first surface on the first insulating layer, disposing a second insulating layer on a second surface of the first insulating layer, forming a cavity in the second insulating layer, mounting an electronic component inside the cavity with an adhesion member, disposing a third insulating layer on the second insulating layer to embed the electronic component, and removing the carrier.

The cavity may be formed at a position corresponding to at least a part of the first circuit.

The method may further include forming a barrier layer on the second surface of the first insulating layer to correspond to the position of the cavity after disposing the first insulating layer. A cross-section area of the barrier layer may greater than that of a bottom of the cavity. The method may further include removing the barrier layer after forming the cavity.

The method may further include forming a second circuit on the second surface of the first insulating layer after disposing the first insulating layer.

The method may further include forming an external terminal on at least a part of the first circuit and protruded from the first surface of the first insulating layer after removing the carrier. The method may further include forming a solder resist layer on the first surface of the first insulating layer to expose a part of a side surface of the external terminal and cover a portion of the first circuit on which the external terminal is not formed after forming the external terminal.

Other features and aspects will be apparent from the following detailed description, the drawings, and the claims.

Throughout the drawings and the detailed description, unless otherwise described or provided, the same reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

It will be understood that, although the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Similarly, when it is described that a method includes series of steps, a sequence of the steps is not a sequence in which the steps should be performed in the sequence, an arbitrary technical step may be omitted and/or another arbitrary step, which is not disclosed herein, may be added to the method.

The terms used herein may be exchangeable to be operated in different directions than shown and described herein under an appropriate environment. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terms used in the description are intended to describe certain embodiments only, and shall by no means restrict the present disclosure. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

The terminology used herein is for the purpose of describing particular examples only, and is not intended to limit the scope of the disclosure in any way. As used herein, the singular forms "a," "an," and "the" are intended to include the plural forms as well, unless the context clearly indicates otherwise. It will be further understood that the terms "include" and/or "have," when used in this specification, specify the presence of stated features, numbers, operations, elements, components, or combinations thereof, but do not preclude the presence or addition of one or more other features, numbers, operations, elements, components or combinations thereof.

Unless otherwise defined, all terms, including technical and scientific terms, used herein have the same meaning as commonly understood by one of ordinary skill in the art to which this description pertains. It will be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, certain embodiments of the present disclosure will be described in detail with reference to the accompanying drawings.

Printed Circuit Board

Figure 1:
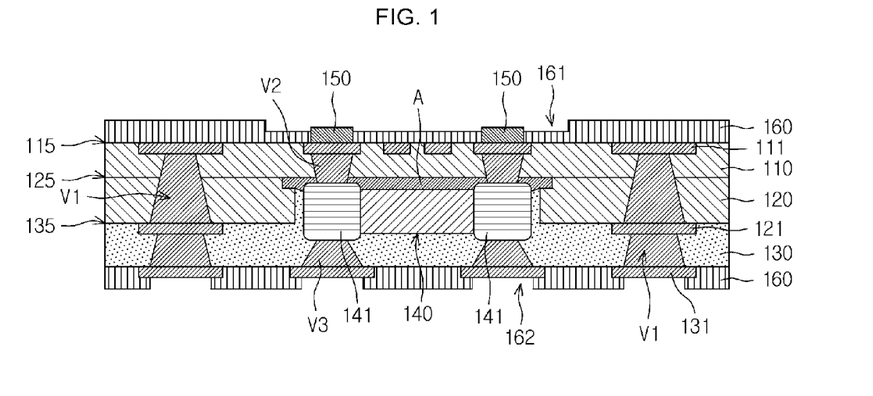
FIG. 1 is a diagram illustrating a first example of a printed circuit board.

FIG. 1 is a diagram illustrating a cross section of a printed circuit board in accordance with a first example.

Referring to FIG. 1, in an example, a printed circuit board includes a first insulating layer 110, a second insulating layer 120, an electronic component 140, and a third insulating layer 130. The printed circuit board further includes a first circuit 111 formed in a first surface 115 of the first insulating layer 110, a cavity 122 (see, FIG. 7) in the second insulating layer 120, electronic component 140 mounted inside the cavity 122 using an adhesion member A. The electronic component 140 is embedded inside the cavity 122, and on a third insulating layer 130.

The first insulating layer 110, the second insulating layer 120 and the third insulating layer 130 may include a thermosetting resin such as an epoxy resin and a thermoplastic resin such as polyimide. The first insulating layer 110 may further include a reinforcing agent into the resin. The reinforcing agent may be a fabric reinforcing agent, an inorganic filler or the like. The fabric reinforcing agent may be a glass cloth or a prepreg (PPG) formed by implementing the glass cloth into the resin.

The first circuit 111 is formed in the first surface 115 of the first insulating layer 110. The first circuit 111 may be embedded inside the first insulating layer 110 and, thus, may not protrude above the first surface 115 of the first insulating layer 110. This reduces a total thickness of the final printed circuit board.

The first circuit 111 may be formed of any conductive material, for example, Cu, Ag, Pd, Al, Ni, Ti, Au, Pt and the like.

A thickness of the first insulating layer 110 may be different from that of the second insulating layer 120. In an embodiment, the thickness of the second insulating layer 120 may be greater than that of the first insulating layer 110. In an embodiment, the first insulating layer 110 may have a thickness sufficient for the cavity 122 and the first circuit 111 to be spaced-apart from each other.

The cavity 122 may correspond to at least a part of the first circuit 111. As used herein, 'correspond to' means that the position of the cavity 122 and the position of at least a part of the first circuit 111 are overlapped in the thickness direction of the printed circuit board. In other words, the cavity 122 may be formed on at least a part of the first circuit 111. Because the first circuit 111 is covered by the first insulating layer 110 as viewed from the second insulating layer 120, and because the cavity 122 does not pass through the first insulating layer 110, the first circuit 111 and the cavity 122 do not directly overlap.

In an embodiment, the circuit in the first circuit 111 formed on the portion corresponding to the position of the cavity 122 is connected with a connection terminal 141 of the electronic component 140 through a via V2. The electronic component 140 may be an active element or a passive element.

In an embodiment, the electronic component 140 is inserted in the cavity 122. In an embodiment, the electronic component 140 is adhered inside the cavity 122 using an adhesion member A. The electronic component 140 may be mounted securely in the cavity 122 by the adhesion member A.

The adhesion member A may be disposed between the electronic component 140 and a bottom of the cavity 122. Even though the adhesion member A is disposed at the bottom of the cavity 122, the adhesion member A may not be in contact with the first circuit 111 because the first insulating layer 110 is disposed between the cavity 122 and the first circuit 111. Thus, delamination between the adhesion member A and the first circuit 111 may be prevented.

The adhesion member A may be formed of a tape, for example, a die attach film (DAF), an epoxy-based adhesive, a non-conductive paste, an anisotropic conductive, or any combination thereof.

When the adhesion member A is an adhesive, the adhesive may be coated at the bottom of the cavity 122 before the electronic component 140 is mounted.

A groove G which is extended to the side may be formed at the bottom of the cavity 122 so as to undercut the vertical walls (not explicitly shown) of the cavity 122. When the adhesion member A is an adhesive, the adhesive may be disposed at the bottom of the cavity 122 and filled in the groove G. When an excessive amount of the adhesive is used, the adhesive may be filled in the groove G such that the amount of the adhesive in contact with the electronic component 140 may be controlled.

The depth of the cavity 122 may be greater than half the thickness of the electronic component 140. If the thickness of the electronic component 140 is much greater than the depth of the cavity 122, the third insulating layer 130 which is to be laminated on the second insulating layer 120 may not sufficiently cover the electronic component 140. Moreover, the glass cloth included in the third insulating layer 130 may be also broken due to contact with the electronic component 140.

On the other hand, if the cavity 122 is too deep, such that the electronic component 140 can be completely inserted inside the second insulating layer 120, a total thickness of the printed circuit board increases. Moreover, it may be difficult to properly position the electronic component 140 when inserting in the cavity 122.

Accordingly, the depth of the cavity 122 may be greater than half the thickness of the electronic component 140 and not greater than the thickness of the electronic component 140.

Additionally, void and undulation issues between the second insulating layer 120 and the third insulating layer 130 may be resolved through control of the depth of the cavity 122.

The third insulating layer 130 may be disposed on the second insulating layer 120 to mount the electronic component 140. In some embodiments, the cavity 122 may be filled with the material of the third insulating layer 130. For example, when the third insulating layer 130 includes a resin, the resin may fill the cavity 122 around the electronic component 140 due to flow of the resin while the third insulating layer 130 is formed on the second insulating layer 120.

The electronic component 140 embedded in the cavity 122 may be first fixed by the adhesion member A and then firmly fixed by the third insulating layer 130.

A second circuit 121 may be formed between the second insulating layer 120 and the third insulating layer 130. The second circuit 121 may be thus formed on a second surface 126 of the second insulating layer 120 which is not in contact with the first insulating layer 110. The second circuit 121 may be electrically connected with the first circuit 111 through a via V1.

A third circuit 131 may be formed on the third insulating layer 130. The third circuit 131 may be thus formed on the surface 136 of the third insulating layer 130 which is not in contact with the second insulating layer 120. The third circuit 131 may be electrically connected with the first circuit 111 and the second circuit 121.

A part of the third circuit 131 may be exposed to the outside and a solder ball may be formed on the exposed third circuit 131. The printed circuit board may be connected with a main board through this solder ball.

A via may form electrical connections between circuits. The via connecting the circuits formed on different layers is represented by a first via V1 in FIG. 1.

The first via V1 may be formed by forming a via hole (not explicitly shown) in the first insulating layer 110, the second insulating layer 120 or the third insulating layer 130 and filling with a conductive material in the via hole.

As shown in FIG. 1, the first via V1 may be formed in a stacked structure by stacking the vias through the entire insulating layers 110, 120, 130. Each via forming the first via V1 may have a different thickness. Because the thickness of the via is related to the thickness of the insulating layer, when the thickness of the first insulating layer 110 is different from that of the second insulating layer 120, the thickness of the via formed in each layer may be different from each other.

More than one of the first via V1 may be formed. The first via V1 may also be formed around the cavity 122 to surround the cavity 122.

A part of the first circuit 111 may be electrically connected with the electronic component 140 through the connection terminal 141 of the electronic component 140. A portion of the first circuit 111 connected with the electronic component 140 is formed at a position corresponding to the cavity 122. A second via V2 may be formed between the first circuit 111 and the connection terminal 141 of the electronic component 140. The second via V2 may pass through the adhesion member A disposed at the bottom of the cavity 122 and the first insulating layer 110.

A part of the third circuit 131 may be electrically connected with the electronic component 140 through the connection terminal 141 of the electronic component 140. A third via V3 may be formed between the third circuit 131 and the connection terminal 141 of the electronic component 140. The third via V3 may pass through the third insulating layer 130.

The second via V2 and the third via V3 may have shapes opposite or mirror images of each other. For example, when the second via V2 is formed in a trapezoid shape, the third via V3 may be formed in a reverse trapezoid shape. When the second via V2 and the third via V3 are formed, the surfaces to form the second via V2 and the third via V3 are opposed to each other.

A method for manufacturing such a printed circuit board will be explained below.

The second via V2 and the third via V3 may be formed by the same method used for forming the first via V1. That is, the second via V2 and the third via V3 may be formed by forming a via hole in the insulating layer and then filling the via hole with a conductive material. Each thickness of the first via V1, the second via V2 and the third via V3 may be different from each other because the thickness is related to the thickness of each insulating layer.

In an embodiment, an external terminal 150 exposed from the first insulating layer 110 is formed on the first circuit 111. In other words, because the first circuit 111 is formed inside the first insulating layer 110, one surface of the first circuit 111 is in contact with the first insulating layer 110 and another surface of the first circuit 111 is exposed to the outside from the first insulating layer 110. The external terminal 150 is formed on the other surface of the first circuit 111 exposed from the first insulating layer 110.

In an embodiment, a solder is formed to mount another electronic component (not explicitly shown) such as a semiconductor chip on the external terminal 150 in the printed circuit board. In such embodiments, the external terminal 150 protrudes from the first insulating layer 110. A pitch of the external terminal 150 is fine. Forming the solder on the external terminal 150 may be facilitated due to the protruded external terminal 150.

In some embodiments, the external terminal 150 is formed on the circuit of the first circuit 111 which is connected through the electronic component 140 and the second via V2.

In an embodiment, a solder resist layer 160 is disposed on the first insulating layer 110 and the third insulating layer 130 to cover and protect the first circuit 111 and the third circuit 131, except parts of the first circuit 111 and part of the third circuit 131 which are exposed to the outside. The external terminal 150 may be formed on the exposed first circuit 111.

An opening 161 may be formed in the solder resist layer 160 disposed on the first insulating layer 110. The opening 161 may expose a side surface of the external terminal 150. A thickness of the external terminal 150 may be less than that of the solder resist layer 160, but the side surface of the external terminal 150 may be exposed by the opening 161. In an embodiment, more than one external terminal 150 may be exposed by the one opening 161 at once.

A depth of the opening 161 may be less than a thickness of the solder resist layer 160. When the opening 161 is formed through a photolithography process to the solder resist layer 160, the opening 161 having a depth less than the thickness of the solder resist layer 160 may be formed using a step developing method.

A part of the side surface of the external terminal 150 may be buried in the solder resist layer 160, the rest part may be protruded from the solder resist layer 160, and the first circuit 111 on which the external terminal 150 is not formed may be covered by the solder resist layer 160. Such a structure aids in preventing shorts or bridges between the side surface of the external terminal 150 and the first circuit 111.

Similarly, an opening 162 may be formed to expose a part of the third circuit 131 in the solder resist layer 160 formed on the third insulating layer 130. A solder ball may be formed on the third circuit 131 exposed by the opening 162. The printed circuit board may be mounted on a main board through this solder ball.

Figure 2:
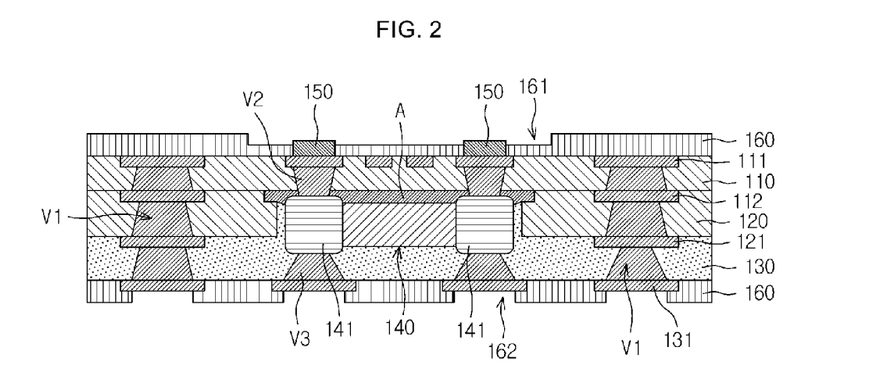
FIG. 2 is a diagram illustrating a second example of a printed circuit board.

FIG. 2 is a diagram illustrating a second example of a printed circuit board.

Referring to FIG. 2, a printed circuit board according to a second example includes a first insulating layer 110, a second insulating layer 120, an electronic component 140, and a third insulating layer 130. A first circuit 111 is embedded in a first surface of the first insulating layer 110. A cavity 122 is formed in the second insulating layer 120, and an electronic component 140 is mounted inside the cavity 122 using an adhesion member A. The electronic component 140 is further fixed mounted inside the cavity 122 by the third insulating layer 130. In this example, in addition to the printed circuit board illustrated in FIG. 1, a fourth circuit 112 is further formed on a second surface of the first insulating layer 110.

The fourth circuit 112 may be formed on the first insulating layer 110 before the second insulating layer 120 is formed on the first insulating layer 110, and may be formed on the same surface as the bottom of the cavity 122.

In an embodiment, the fourth circuit 112 is electrically connected with the first circuit 111, the second circuit 121, and the third circuit 131 through a first via V1.

The printed circuit board in the first example has three circuit layers, while the printed circuit board in the second example has four circuit layers.

Even though the printed circuit board is formed in four layers, it has the same total thickness so that the printed circuit board with a thinner size may be provided. The total thickness of the printed circuit board with three or four circuit layers in accordance with the first or the second example may be, for example, 1.2 mm.

Method for Manufacturing a Printed Circuit Board

FIGS. 3 to 16 are diagrams illustrating a first example of a method for manufacturing a printed circuit board.

Referring to FIGS. 3 to 16, a method for manufacturing a printed circuit board according to a first example includes forming a first circuit 111 on a carrier C, forming a first insulating layer 110 on the carrier C, forming a second insulating layer 120 on the first insulating layer 110, forming a cavity 122 on the second insulating layer 120, mounting an electronic component 140 inside the cavity 122, forming a third insulating layer 130 on the second insulating layer 120, and eliminating the carrier C.

Figure 3:
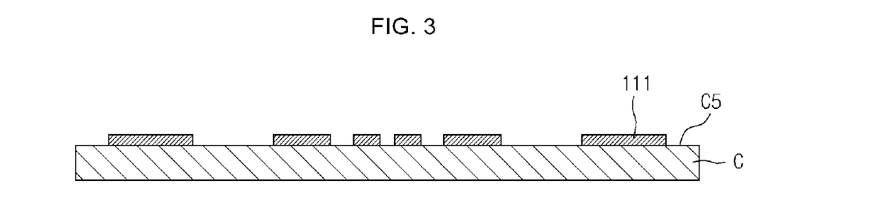
FIGS. 3 to 16 are diagrams illustrating a first example of a method for manufacturing a printed circuit board.

The carrier C may include an insulating material, a first metal layer disposed on the surface of the insulating material, and a second metal layer disposed on the first metal layer.

The insulating material may include a thermosetting resin such as, for example, an epoxy resin and a thermoplastic resin such as, for example, polyimide. The insulating material may further include a reinforcing agent such as, for example, a fabric reinforcing agent, or an inorganic filler. The fabric reinforcing agent may be a glass cloth and a prepreg (PPG) formed by incorporating the glass cloth into the resin.

The first metal layer and the second metal layer may be a copper foil and a thickness of the first metal layer may be greater than that of the second metal layer.

Figure 4:
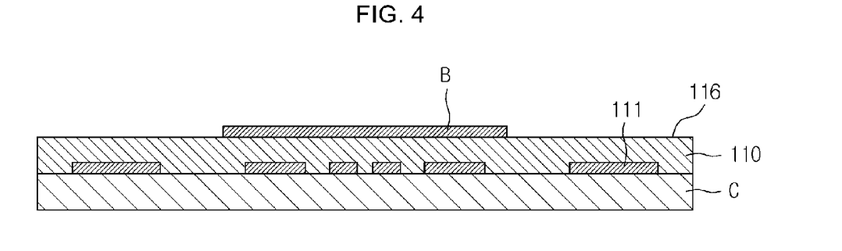

The first circuit 111 is formed on a first surface C5 of the carrier C. The first insulating layer 110 is formed on the first surface C5 of the carrier C to bury the first circuit 111. In other words, after the first insulating layer 110 is formed, the first circuit 111 is embedded in the first insulating layer 110 on a first surface 115 of the first insulating layer 110.

The first circuit 111 may be formed by an additive process, a subtractive process, or a semi-additive process. However, the method may not be limited thereto.

Figure 6:
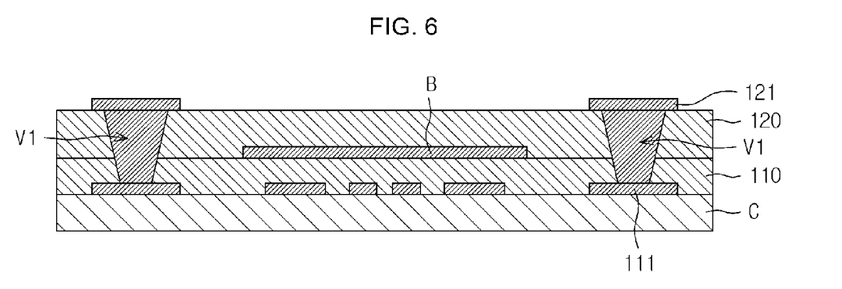

The second insulating layer 120 is formed on a second surface 116 of the first insulating layer 110 opposite the first surface 115. The second insulating layer 120 may be laminated on a second surface 116 of the first insulating layer 110, opposite the first surface 115 in which the first circuit 111 is formed.

Figure 7:
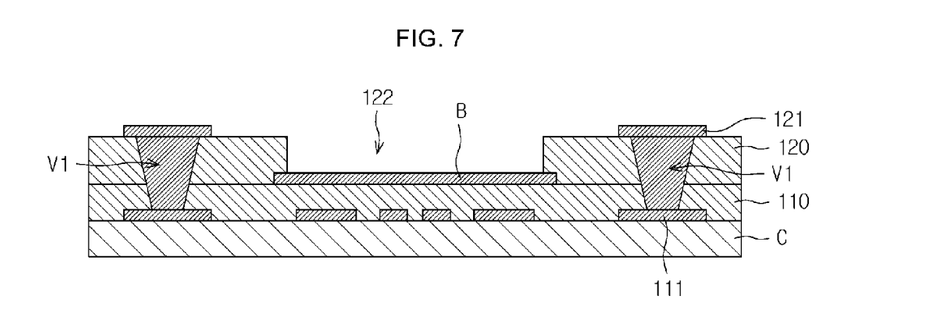

The cavity 122 is formed in the second insulating layer 120. The cavity 122 may be formed using a mechanical drill or a laser drill. The cavity 122 may be formed to pass through from a first 125 surface of the second insulating layer 120 to a second surface 126 but not pass through the first insulating layer 110.

When the cavity 122 is formed using a mechanical drill or a laser drill, damage may occur to the portion of the first circuit 111 corresponding to the position of the cavity 122. Such damage may be prevented by forming the first circuit 111 first, covering the first circuit 111 by the first insulating layer 110, laminating the second insulating layer 120 on the first insulating layer 110, followed by forming the cavity 122 in the second insulating layer 120.

The cavity 122 may be formed first in a punched shape in the second insulating layer 120 and the punched second insulating layer 120 may be formed on the first insulating layer 110.

Figure 11:
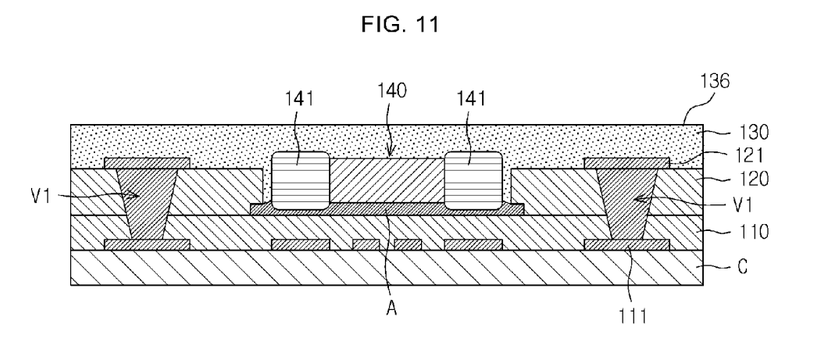

The electronic component 140 is mounted inside the cavity 122 using an adhesion member A. In embodiments where the adhesion member A is an adhesive, it may be coated at the bottom of the cavity 122 before the electronic component 140 is mounted. The adhesion member A may be formed uniformly because the bottom of the cavity 122 is flat.

Figure 5:
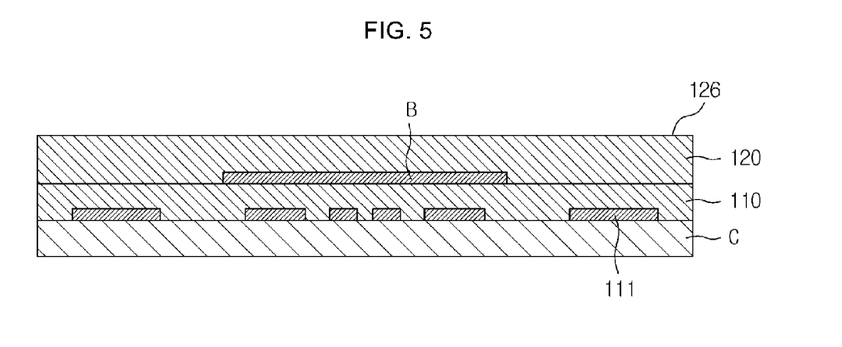

The method may further include forming a barrier layer B on the second surface 116 of the first insulating layer 110 after forming the first insulating layer 110.

The barrier layer B may be formed to correspond to the position of the cavity 122. The barrier layer B may function as a stopper in forming the cavity 122. For example, when the cavity 122 is formed by a laser drill and the barrier layer B is formed of a metallic material, the laser does not process the metal but only the resin of the second insulating layer 120. Thus, only the second insulating layer 120 may be processed. Thus, when the cavity 122 is processed by using a laser, depth may be easily controlled.

The barrier layer B may be formed of a metallic material or any material which is able to function as a stopper when forming the cavity 122.

In embodiments where the barrier layer B is formed of a metallic material, it may be formed by a subtractive process or a tenting process. The barrier layer B may be formed by laminating a metal layer on the second surface 116 of the first insulating layer 110 and selectively etching the portion of the metal layer which is not needed.

The barrier layer B may also be formed by adhering a material which can be used for the barrier layer B on the other surface of the first insulating layer 110, regardless of the material used for the barrier layer B.

The barrier layer B may or may not be eliminated from the final product. For example, when the barrier layer B is formed of a metallic material, it may be eliminated from the final product to prevent undesired shorts. On the other hand, when the barrier layer B is formed of a non-metallic material, it may not be eliminated from the final product.

Figure 8:
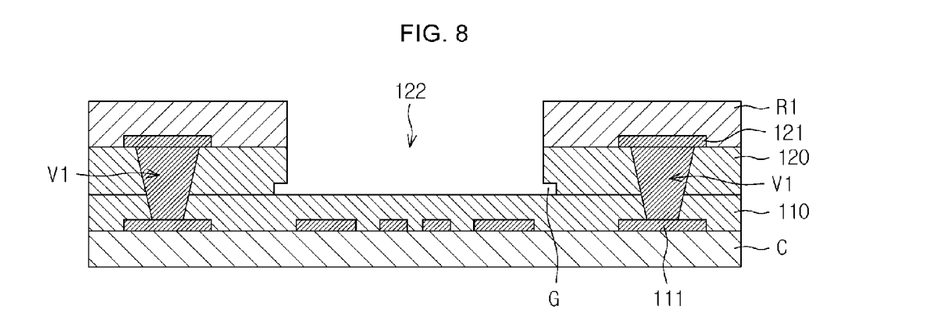

When the barrier layer B is formed of a metallic material, it may be eliminated using an etching process. In the etching process, an etching resist R1 is formed on the second insulating layer 120 to expose only the barrier layer B in order to selectively eliminate the barrier layer B. The etching resist R1 may be a dry film D/F.

The barrier layer B may have an area greater than that of the bottom of the cavity 122. Because process deviation may occur when the cavity 122 is formed using a laser drill, the cavity 122 may be formed to be smaller than the barrier layer B to accommodate the processing deviation.

Figure 9:
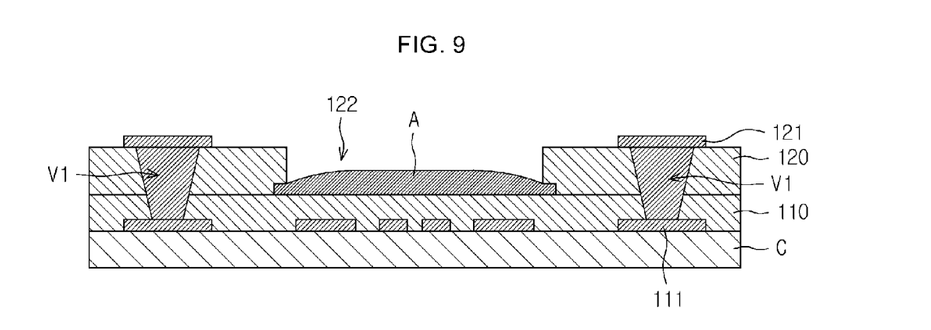

In embodiments where the barrier layer B is formed to be larger than an area of the bottom of the cavity 122 and the barrier layer B is eliminated after forming the cavity 122, a groove G which is extended to the side may be formed at the bottom of the cavity 122. In such embodiments, a thickness of the groove G is equal to that of the barrier layer B and a depth of the groove G is equal to the difference between the dimensions of the barrier layer B and the dimensions of the cavity 122. The groove G has been described in detail elsewhere herein.

Figure 10:
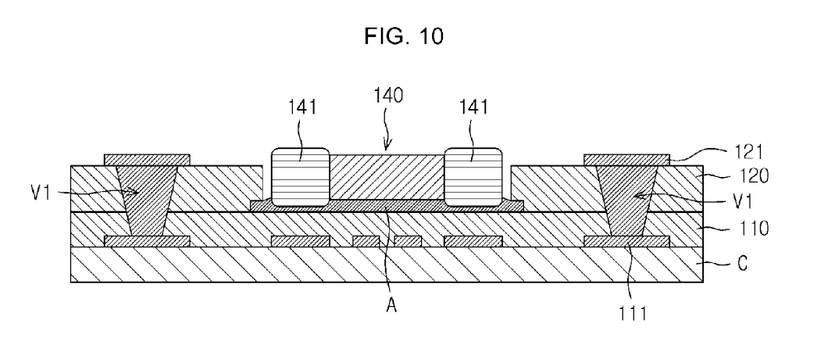

A second circuit 121 is then formed on the second insulating layer 120 using any of the operations and techniques known in the art. For example, forming the second circuit 121 may include depositing a metal layer on the second surface 126 of the second insulating layer 120, and selectively etching the metal layer to form a pattern for the second circuit 121.

The first circuit 111 and the second circuit 121 may be connected through a via. To form the via, a via hole may be drilled through the second insulating layer 120 and the first insulating layer 110, followed by filling the via hole with a conducting material. The via hole may be positioned on a connecting pad of the first circuit 111. The via hole may be drilled using any method known in the art such as, for example, laser drilling or mechanical drilling. The conductive material filling the via hole may include, without limitation, a conductive paste, a metal such as copper, gold, silver, aluminum or nickel, a conducting polymer, or any combination thereof.

An adhesive member A is then disposed at the bottom of the cavity 122 on the second surface 116 of the first insulating layer 110. The adhesive member A may include an adhesive paste, a tape, or any other means for securing the electronic component 140 within the cavity 122. The electronic component 140 is then mounted in the cavity 122. The details of the operations of mounting the electronic component 140 have been described elsewhere herein. For example, the electronic component 140 placed in the cavity 122 manually or using a precision robot on the adhesive member A so as to secure the electronic component 140 within the cavity 122.

Figure 12:
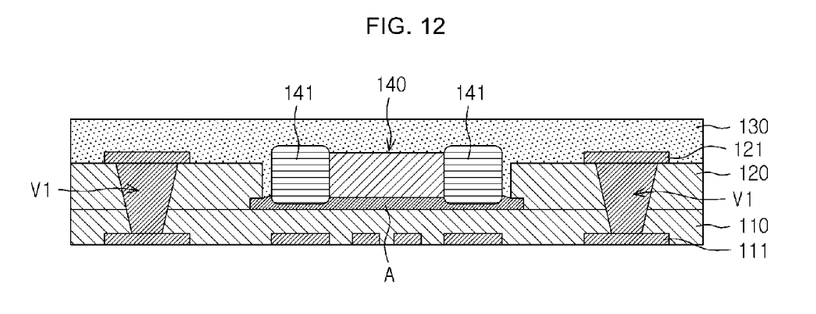

After the electronic component 140 is mounted in the cavity 122, the third insulating layer 130 may be formed on the electronic component 140 such as to completely embed the electronic component 140 inside the cavity 122. The third insulating layer 130 may be laminated on the second insulating layer.

A third circuit 131 may then be formed on a second surface 136 of the third insulating layer 130. A part of the third circuit 131 may be exposed to the outside to be connected with a main board.

The first circuit 111, the second circuit 121, and the third circuit 131 may be electrically connected through a via. The via connecting the circuits formed on different layers is represented by a first via V1.

Sections of the first via V1 may be formed after forming the corresponding insulating layer. That is, after forming the first insulating layer 110 and the second insulating layer 120, the first via V1 may be formed to pass through the first insulating layer 110 and the second insulating layer 120. After forming the third insulating layer 130, the first via V1 may be formed between the second circuit 121 and the third circuit 131 to pass through the third insulating layer 130. The via hole may be formed by using a mechanical drill or a laser drill. When the via hole is formed using a laser drill, it may be formed in a tapered shape as shown in FIG. 1. In embodiments where the via hole is formed using a mechanical drill, the cross-section of the via hole may have a constant width. The conductive material may be filled through a plating method or a conductive paste filling method. However, this filling method may not be limited thereto.

The first via V1 may be formed in a stacked structure by stacking the vias through the entire insulating layers of the first insulating layer 110, the second insulating layer 120, and the third insulating layer 130.

Figure 13:
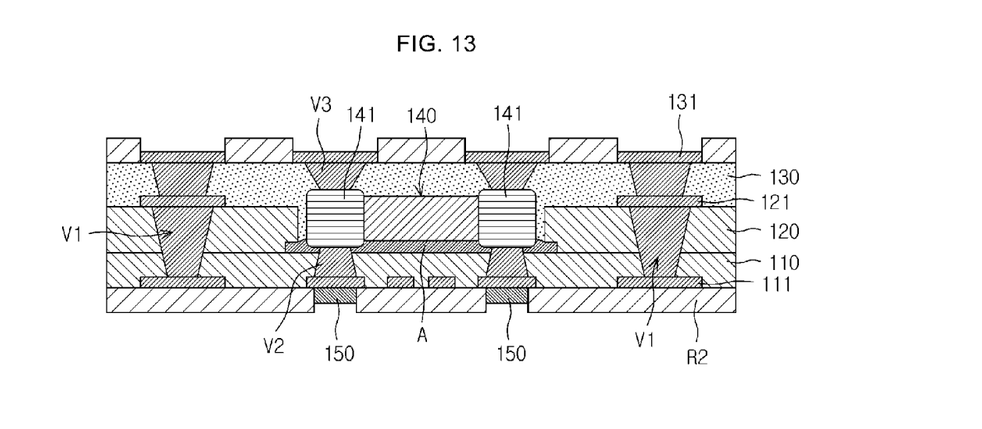

After forming the third insulating layer 130, the carrier C may be removed. In embodiments where the carrier C includes an insulating material, a first metal layer and a second metal layer (not explicitly shown), the first metal layer and the second metal layer are first separated, and the first metal layer and the insulating material are then removed, such that the second metal layer is left behind on the printed circuit board.

Figure 14:
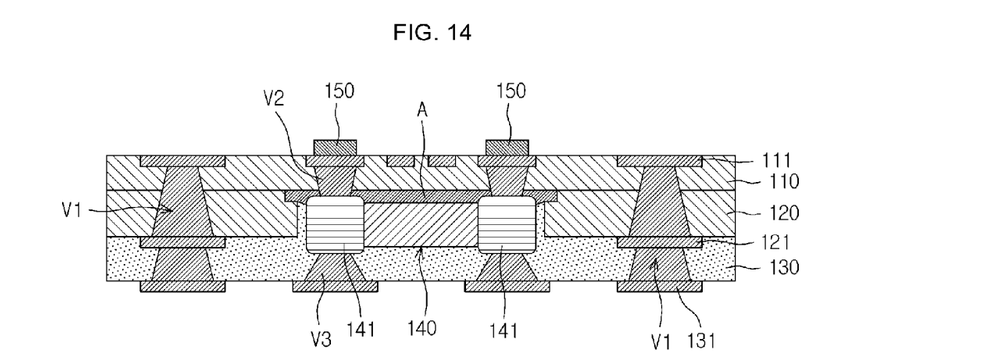

After the carrier C is eliminated, in some embodiments, a second via V2 and a third via V3 is formed. The second via V2 connects between the first circuit 111 and a connection terminal 141 of the electronic component 140 by passing through the first insulating layer 110 and the adhesion member A. The third via V3 connects between the third circuit 131 and the connection terminal 141 of the electronic component 140 by passing through the third insulating layer 130.

Because when the second via V2 is formed, a via hole may be processed from the surface of the first insulating layer 110 and when the third via V3 is formed, a via hole may be processed from the surface of the third insulating layer 130, the second via V2 may be formed in a tapered shape and the third via V3 in a reverse tapered shape (mirroring the second via V2 about the second insulating layer 120).

Figure 15:
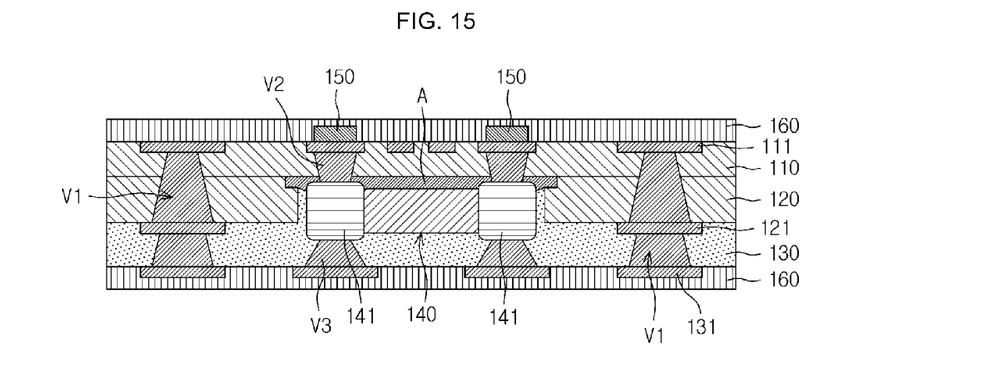

The method of forming the printed circuit board in accordance with various embodiments described herein may further include forming an external terminal 150 on the first circuit 111 after forming the second via V2 and the third via V3. The external terminal 150 may protrude from the first insulating layer 110. The external terminal 150 may be formed on a part of the first circuit 111, and the portion of the first circuit 111 on which the protruded external terminal 150 is formed may be connected with the electronic component 140 through the second via V2.

The external terminal 150 may be formed of a suitable conductive material such as, for example, a metal. The external terminal 150 may be selectively plated on the first circuit 111 by forming a photoresist or a plating resist R2 on the first insulating layer 110 and performing an exposing and developing process. The external terminal 150 may protrude from the first insulating layer 110 by controlling a plating thickness.

Figure 16:
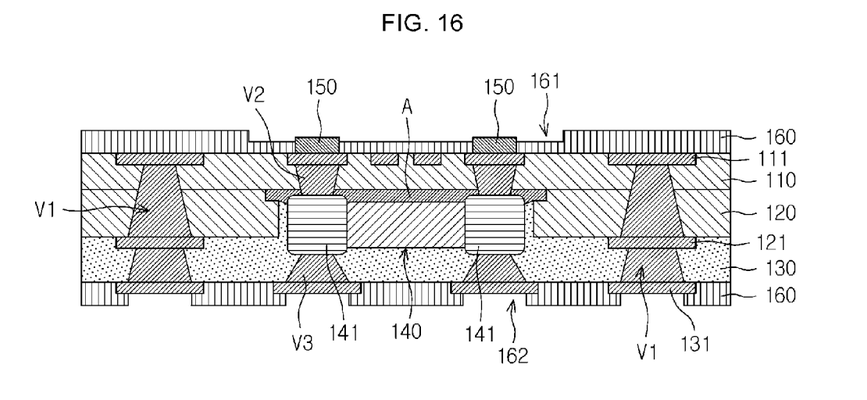
Figure 17:
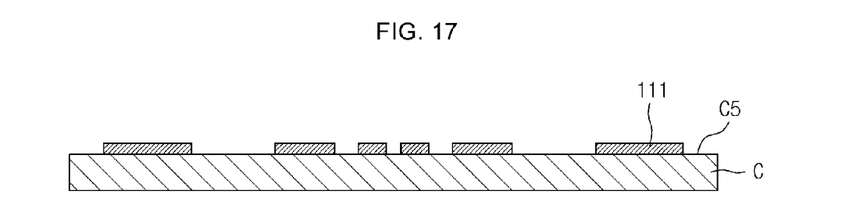
FIGS. 17 to 30 are diagrams illustrating a second example of a method for manufacturing a printed circuit board.
Figure 18:
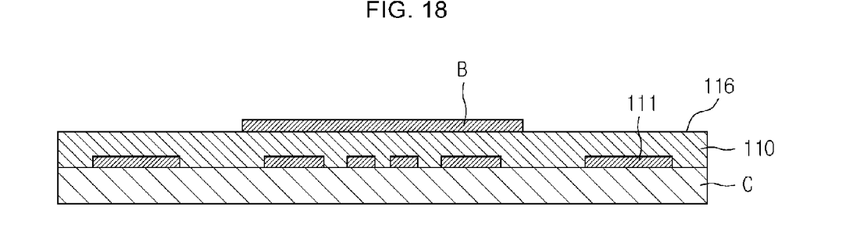
Figure 19:
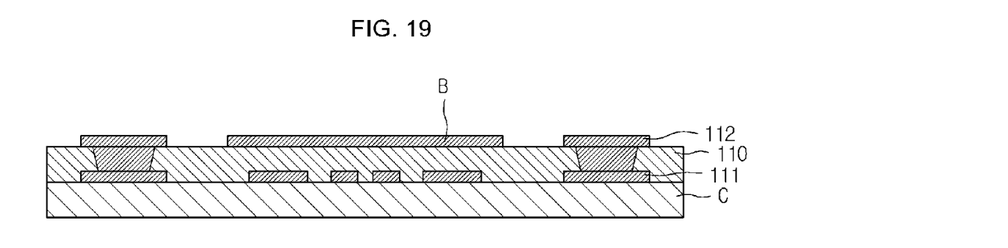
Figure 20:
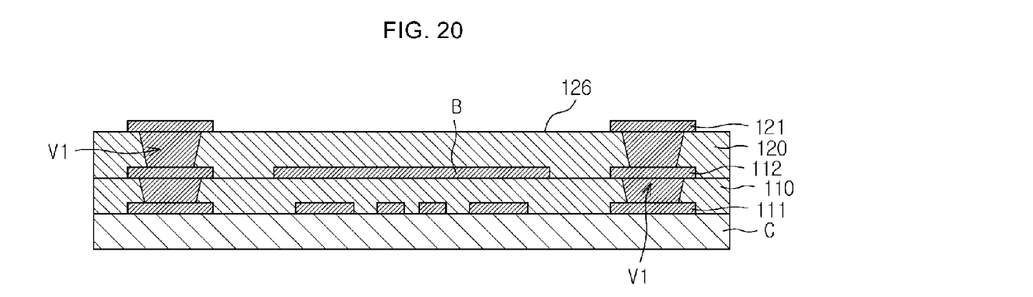
Figure 21:
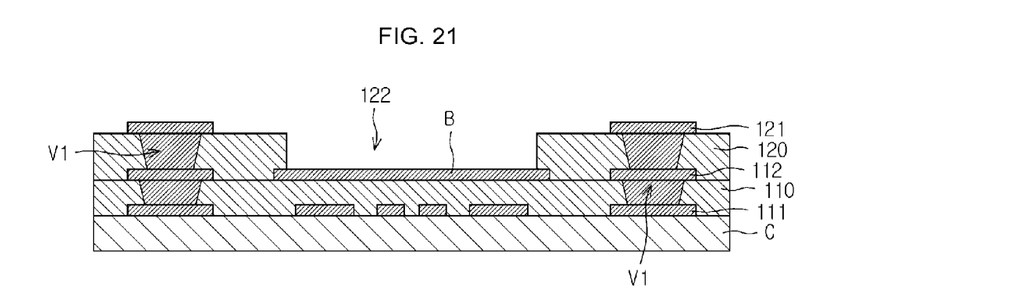
Figure 22:
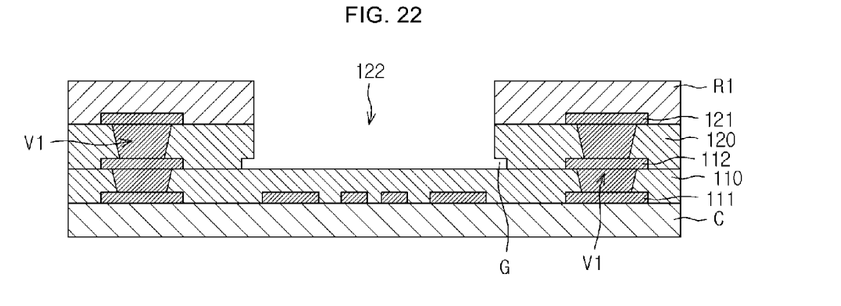
Figure 23:
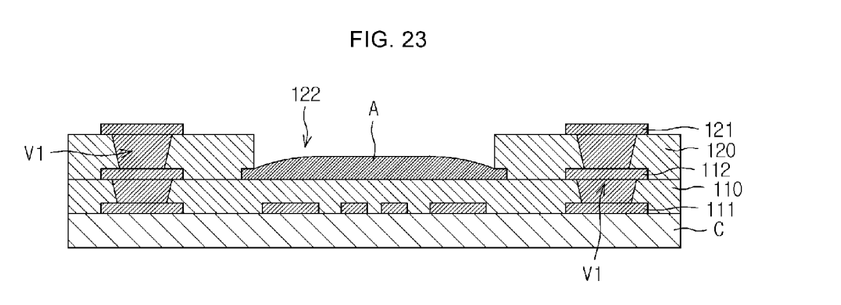
Figure 24:
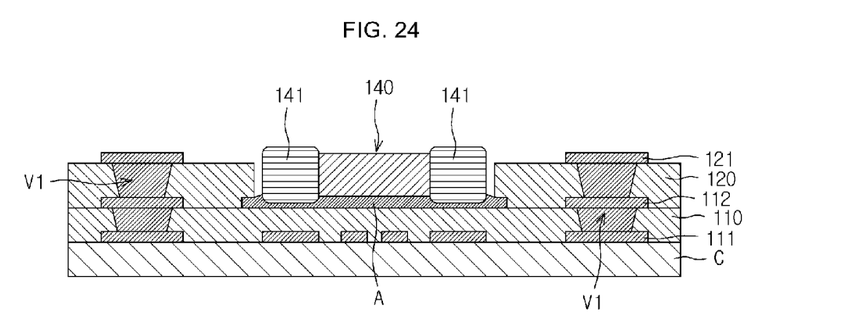
Figure 25:
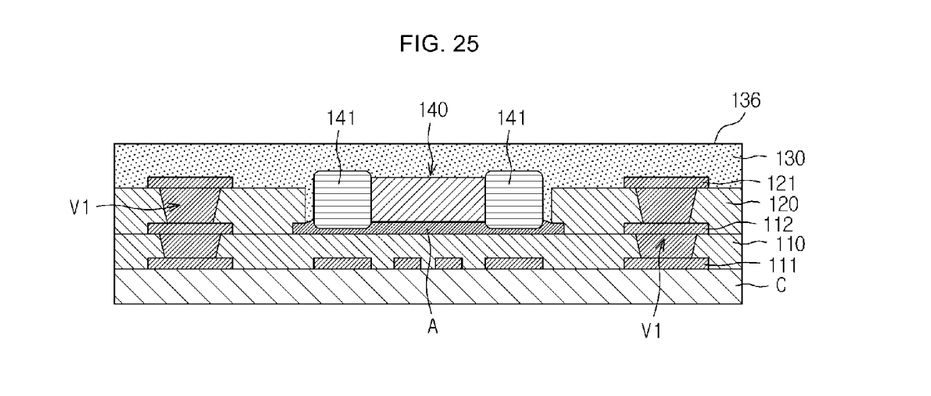
Figure 26:
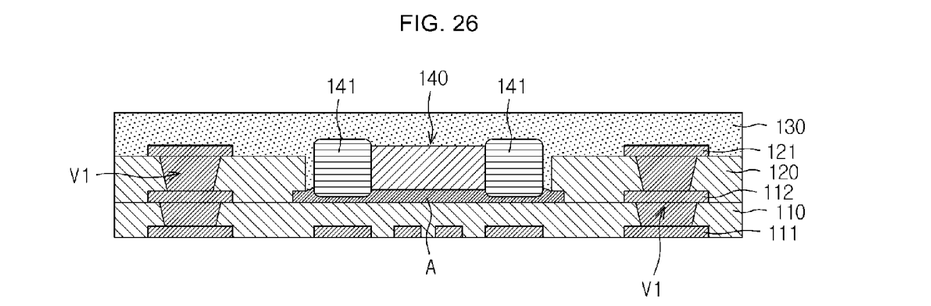
Figure 27:
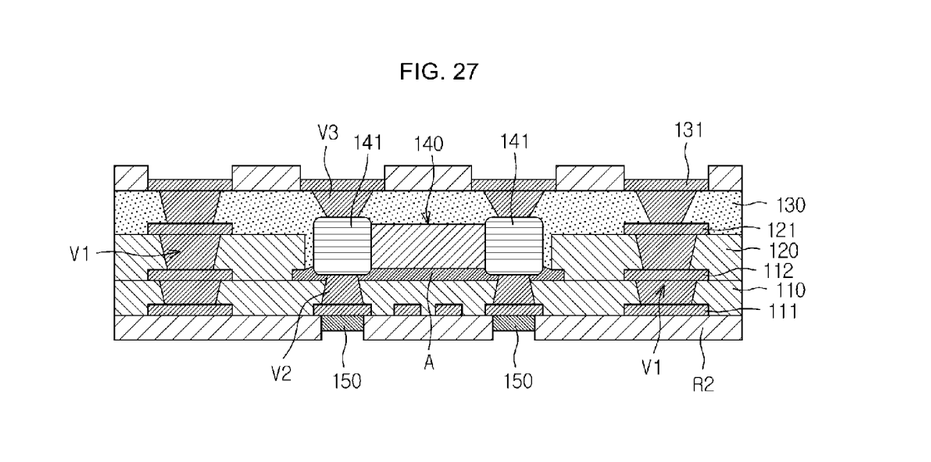
Figure 28:
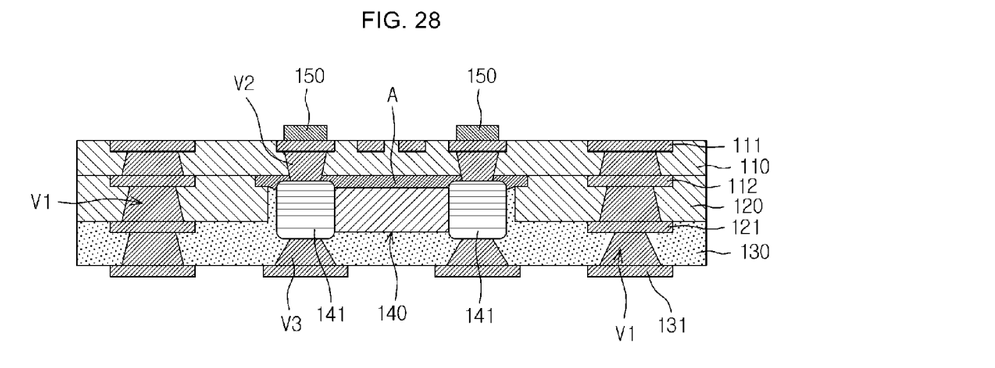
Figure 29:
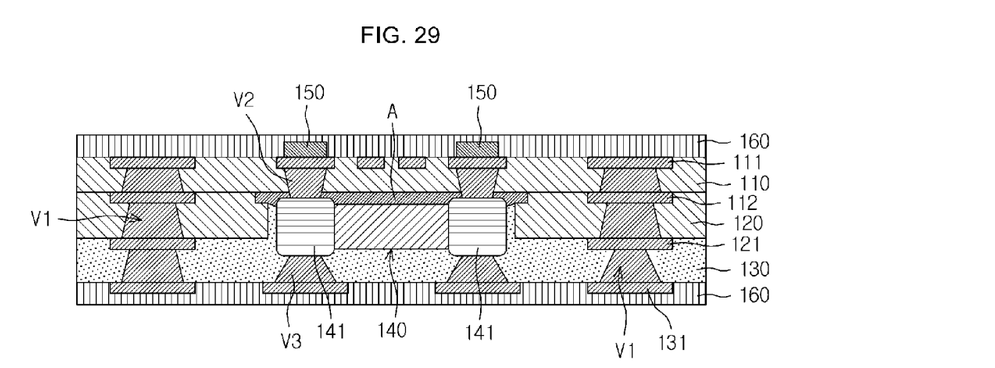
Figure 30:
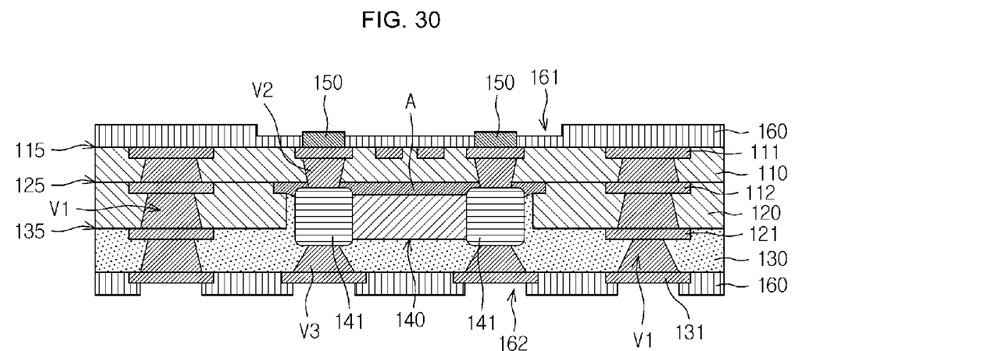

The method may further include forming a solder resist layer 160 on the exposed surfaces 115 and 136 respectively of the first insulating layer 110 and the third insulating layer 130 after forming the external terminal 150.

The solder resist layer 160 may cover the first circuit 111 and the third circuit 131 but expose the external terminal 150 formed on the first circuit 111 and a part of the third circuit 131.

The external terminal 150 may protrude from the solder resist layer 160. In this case, an opening 161 may be formed in the solder resist layer 160 to expose the side surface of the external terminal 150. An opening 162 may be also formed in the solder resist layer 160 to expose a part of the third circuit 131. The openings 161, 162 may be formed through a photolithography process.

The above-described method results in a printed circuit board having a three-layered circuit structure in accordance with the various embodiments disclosed herein.

FIGS. 17 to 30 are diagrams illustrating a second example of a method for manufacturing a printed circuit board.

Referring to FIGS. 17 to 30, a method for manufacturing a printed circuit board according to a second example includes forming a first circuit 111 on a carrier C, forming a first insulating layer 110 on the carrier C, forming a second insulating layer 120 on the first insulating layer 110, forming a cavity 122 in the second insulating layer 120, mounting an electronic component 140 inside the cavity 122, forming a third insulating layer 130 on the second insulating layer 120, and eliminating the carrier C.

The method for manufacturing a printed circuit board according to a second example further includes forming the carrier C on a first surface 115 of the first insulating layer 110 and forming a fourth circuit 112 on a second surface 116 of the first insulating layer 110 unlike the method for manufacturing a printed circuit board according to a first example.

The fourth circuit 112 may be formed after forming the first insulating layer 110. The fourth circuit 112 may be formed using the same method used for forming the barrier layer B. After forming the fourth circuit 112 and the barrier layer B, the second insulating layer 120 may be formed and after forming the cavity 122, the barrier layer B may be selectively eliminated. Other operations in the method of manufacturing the printed circuit board according to the second example may be similar to the method of manufacturing the printed circuit board according to the first example described herein.

The method according to the second example, results in a printed circuit board having a four-layered circuit structure.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
a first insulating layer having a first circuit embedded in a first surface thereof;
a second insulating layer disposed on a second surface of the first insulating layer, the second insulating layer having a cavity therein and a groove formed to be extended into a side at a bottom of the cavity;
an electronic component mounted inside the cavity with an adhesion member; and
a third insulating layer disposed on the second insulating layer to embed the electronic component,
wherein the adhesion member is disposed between the bottom of the cavity and the electronic component, fills the groove, and contacts the bottom of the cavity and the electric component.

2. The printed circuit board of claim 1, wherein the cavity is formed at a position corresponding to at least a part of the first circuit.

3. The printed circuit board of claim 1, wherein the cavity passes through from a first surface of the second insulating layer to a second surface of the second insulating layer.

4. The printed circuit board of claim 1, further comprising a second circuit disposed on the second surface of the first insulating layer.

5. The printed circuit board of claim 1, further comprising an external terminal disposed on at least a part of the first circuit and protruded from the first surface of the first insulating layer.

6. The printed circuit board of claim 5, further comprising a solder resist layer formed on the first surface of the first insulating layer to expose a part of a side surface of the external terminal and cover a portion of the first circuit on which the external terminal is not formed.

7. The printed circuit board of claim 5, further comprising a via formed to pass through the first insulating layer to connect between the electronic component and the first circuit on which the external terminal is formed.

8. The printed circuit board of claim 1, further comprising a via passing through the first insulating layer and the adhesion member, the via connecting the first circuit and a connection terminal of the electronic component.

9. The printed circuit board of claim 1, further comprising a third circuit disposed on a second surface of the third insulating layer, the second surface being opposite a surface of the third insulating layer in contact with the second insulating layer.

10. The printed circuit board of claim 9, further comprising a via passing through the third insulating layer, the via connecting the third circuit and a connection terminal of the electronic component.

* * * * *